(12) United States Patent
Keramat et al.

(10) Patent No.: US 7,898,056 B1
(45) Date of Patent: Mar. 1, 2011

(54) SEAL RING FOR REDUCING NOISE COUPLING WITHIN A SYSTEM-ON-A-CHIP (SOC)

(75) Inventors: Mansour Keramat, San Jose, CA (US); Syed S. Islam, Cupertino, CA (US); Mehrdad Heshami, Stanford, CA (US)

(73) Assignee: Alvand Technology, Inc., Santa Clara, CA (US)

( * ) Notice: Subject to any disclaimer, the term of this patent is extended or adjusted under 35 U.S.C. 154(b) by 55 days.

(21) Appl. No.: 12/331,373

(22) Filed: Dec. 9, 2008

(51) Int. Cl.
*H01L 29/06* (2006.01)
*H01L 23/552* (2006.01)

(52) U.S. Cl. .......... 257/503; 257/499; 257/491; 257/484; 257/483; 257/170; 257/E23.114; 257/E29.007

(58) Field of Classification Search .......... 257/503, 257/499, 488, 491, 484, 483, 127, 170, E29.007, 257/E23.114
See application file for complete search history.

(56) References Cited

U.S. PATENT DOCUMENTS 6,492,716 B1 * 12/2002 Bothra et al. .......... 257/678
2005/0110119 A1 * 5/2005 Chen .......... 257/620
2006/0197214 A1 * 9/2006 Chen .......... 257/688
2007/0001004 A1 * 1/2007 Mallikarjunaswamy et al. .......... 235/435
2008/0061397 A1 * 3/2008 Uchida .......... 257/508
2009/0250783 A1 * 10/2009 Nakashiba .......... 257/508
2009/0294929 A1 * 12/2009 Lee et al. .......... 257/659
2010/0102421 A1 * 4/2010 Chang et al. .......... 257/659

* cited by examiner

*Primary Examiner* — Victor A Mandala
(74) *Attorney, Agent, or Firm* — Maryam Imam; IPxLAW Group LLP (57) ABSTRACT

Disclosed is a seal-ring architecture that can minimize noise injection from noisy digital circuits to sensitive analog and/or radio frequency (RF) circuits in system-on-a-chip (SoC) applications. In order to improve the isolation, the seal-ring structure contains cuts and ground connections to the segment which is close to the analog circuits. The cuts are such that the architecture is fully compatible with standard design rules and that the mechanical strength of the seal rings is not significantly sacrificed. Some embodiments also include a grounded p-tap ring between the analog circuits and the inner seal ring in order to improve isolation. Some embodiments also include a guard strip between the analog circuits and the digital circuits to minimize the noise injection through the substrate.

25 Claims, 7 Drawing Sheets

SEAL RING FOR REDUCING NOISE COUPLING WITHIN A SYSTEM-ON-A-CHIP (SOC)

CROSS REFERENCE TO RELATED APPLICATIONS

This application relates to U.S. patent application Ser. No. 12/331,386, filed on Dec. 9, 2008 and entitled "Effective Shield Structure For Improving Substrate Isolation of Analog Circuits From Noisy Digital Circuits On a System-On-Chip (SoC)", by Mansour Keramat, Mehrdad Heshami, and Syed Islam.

FIELD OF THE INVENTION

The present invention relates generally to integrated circuit (IC) design and manufacturing, and more specifically to the design and manufacturing of seal rings for ICs that include both an analog circuit and a digital circuit.

BACKGROUND OF THE INVENTION

A single modern semiconductor integrated circuit (IC), commonly referred to as a chip, frequently contains both one or more analog circuits and one or more digital circuits. Combining analog circuits and digital circuits within the same IC is commonly called a system-on-a-chip (SoC). An IC that implements a SoC provides significant advantages for the electronic device that includes such a chip. These advantages include: increased speed and reduced power, because more of the electronic device's signals stay within the SoC IC. These advantages also include reduced cost and reduced area requirements, because more of the electronic device is implemented within each SoC IC than would be implemented using a larger quantity of special purpose ICs.

However, implementing both an analog circuit and a digital circuit within the same IC poses very substantial design challenges. One of the foremost among these challenges is that electronic noise generated in the digital circuit generally transfers over to the analog circuit. Such electronic noise can easily interfere with the proper operation of the analog circuit. Such a noise transfer is also known as a coupling or an injection.

A digital circuit generally operates based on large swings in the voltages of its signal wires and clock wires. These large swings can produce substantial electrical noise in the power supply lines (i.e., $V_{dd}$ lines), in the signal ground lines (i.e., $V_{ss}$ lines), and in the substrate of the IC (i.e., the package ground). A SoC IC may provide a digital $V_{dd}$ and a digital $V_{ss}$ that are respectively kept separate from an analog $V_{dd}$ and an analog $V_{ss}$. However, a single IC must be implemented using a single substrate.

Digital circuits are generally more immune to electrical noise than are analog circuits. Thus, such noise is not usually enough to disrupt the operation of other digital circuits even if they are nearby. In contrast, analog circuits often operate with signals where relatively small voltage swings can be of crucial significance. Thus such noise may be enough to disrupt the proper functioning of an analog circuit even if a substantial distance separates the location of the analog circuit from the location of the digital circuit. In addition to noise transfer via $V_{dd}$, $V_{ss}$, and the substrate, modern ICs generally have one or more seal rings that surround a central area of the IC. In conventional systems, seal rings are continuous metal rings that encircle the central area of the IC. The central area contains the entire circuitry of the IC including the analog and/or digital circuit, the ESD circuit, as well as pads for input/output (TO) signals, for power, and for ground.

The seal rings reduce the penetration of moisture and chemicals into the central area.

The seal rings also reduce mechanical stress on the central area. The IC manufacturing process generally includes a step in which a semiconductor wafer containing multiple copies of an IC is sawed into individual dies, where each die contains one copy of the IC. This reduction in mechanical stress is particularly important during the wafer sawing step, but is also beneficial during the steps between wafer sawing and completing the packaging of the IC.

Unfortunately, seal rings generally provide an electrical channel that transfers a significant amount of the electronic noise that is generated in the digital circuit to the analog circuit.

Thus, there is a need for a system that reduces transfer of electronic noise from a digital circuit to an analog circuit within the same IC, where the transfer is via the seal rings and the substrate. There is also a need for a method of manufacturing such a system.

SUMMARY OF THE INVENTION

To overcome the limitations described above, and to overcome other limitations that will become apparent upon reading and understanding this specification, the present invention includes an integrated circuit (IC) having one or more seal rings.

The IC includes a central area of the IC that hosts all the circuitries and an inner seal ring. The central area is partitioned to isolate a digital circuit and an analog circuit. The inner seal ring surrounds the central area and has two inner gaps, where the gaps divide the inner seal ring into an analog inner ring portion and a digital inner ring portion. In some embodiments, the analog inner ring is connected to the chip ground at package level.

Some embodiments further include an outer seal ring that surrounds the inner seal ring. The outer seal ring optionally includes two outer gaps. In some embodiments, the inner gaps and the outer gaps are aligned with the partition that separates the analog circuit from the digital circuit.

Other embodiments further include a grounded p-tap ring formed from one or more taps to the substrate of the IC. The p-tap ring is positioned between the analog circuit and the analog inner ring portion, and has one or more connections to one or more ground pads within the analog circuit.

Yet other embodiments further include a guard strip within the central area that is positioned between the analog circuit and the digital circuit.

These and other aspects of the present invention will become apparent to those skilled in the art after having read the figures and the following detailed description.

DETAILED DESCRIPTION

In the following description of the embodiments, reference is made to the accompanying drawings that form a part hereof, and in which is shown by way of illustration of the specific embodiments in which the invention may be practiced. It is to be understood that other embodiments may be utilized because structural, functional, usage, and other changes may be made without departing from the scope of the present invention.

Figure 1:
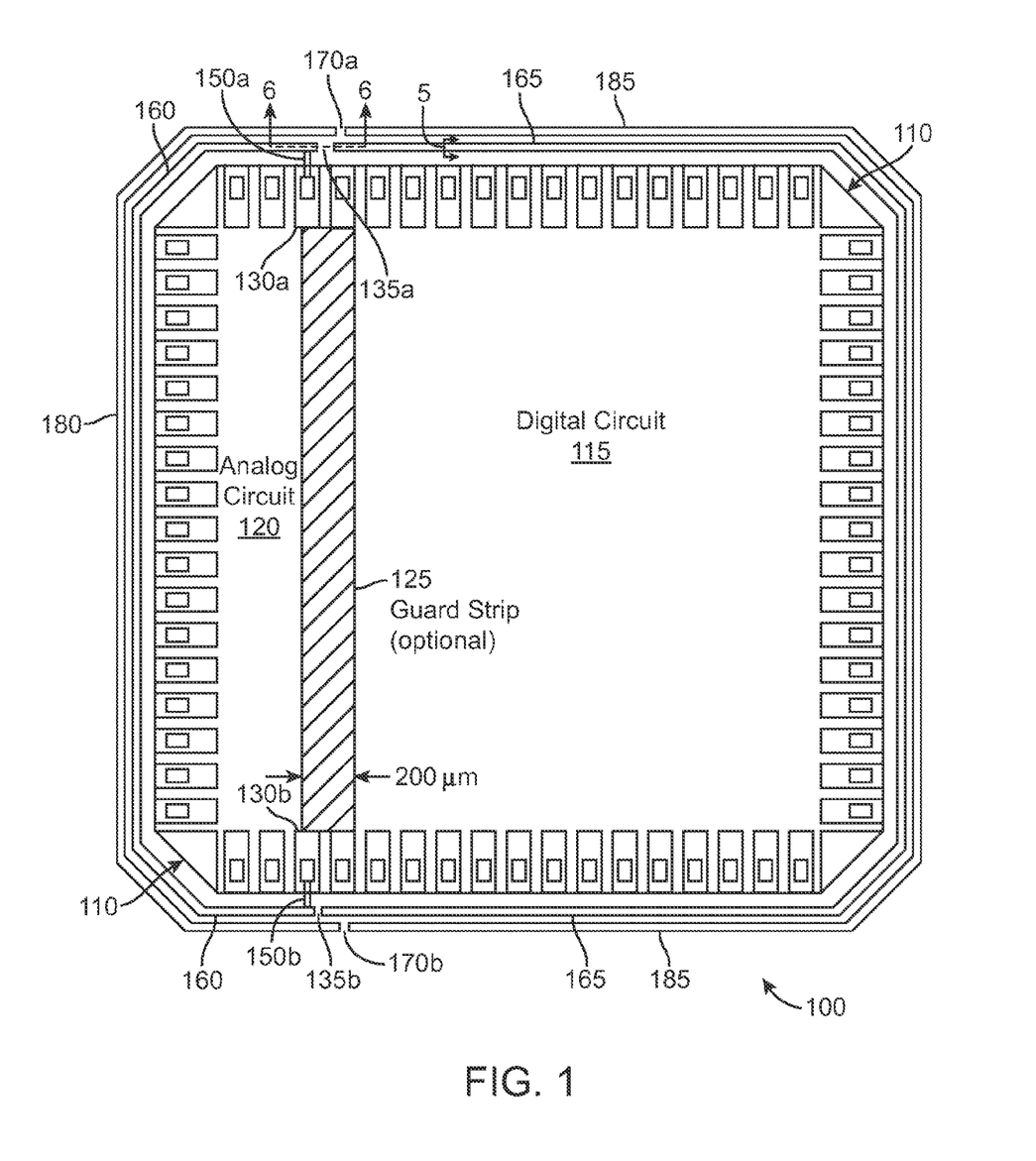
FIG. 1 shows a cut away top view of an integrated circuit (IC) according to an embodiment of the present invention.

FIG. 1 shows a top view of the integrated circuit (IC) 100 according to an embodiment of the present invention. The IC 100 includes: i) the central area 110; ii) the inner seal ring that includes the analog inner ring portion 160 and the digital inner ring portion 165; iii) one or more packaging wires 150 that connect the analog inner ring portion 160 with one or more Vss pads 130 within the analog circuit 120 within the central area 110; and iv) the outer seal ring that includes the analog outer ring portion 180 and the digital outer ring portion 185. Vss pads 130 is an example of a pad. Pads are shown distributed throughout all of the sides of the IC 100 and include pads used to transfer information in and out of the IC, such pads are referred to as "I/O pads". Vss as used herein refers to ground or the lower power supply. $V_{dd}$ as used herein refers to the higher power supply. In FIG. 1, packaging wires 150 are shown as 150a and 150b and Vss pads 130 are shown as Vss 130a and 130b. It is understood that while two packaging wires are shown in the embodiment of FIG. 1, that any number of wires may be employed. Similarly, it is understood that while two Vss pads are shown in the embodiment of FIG. 1, that any number of Vss pads may be employed.

The inner seal ring 160 and 165 surrounds the central area 110. The outer seal ring 180 and 185 surrounds the inner seal ring. In some embodiments, each of the seal rings are 6 microns (μm) wide and are separated by 2 μm.

In conventional systems, seal rings are continuous metal rings that encircle the central area of the IC. However, in the various embodiments of the present invention, the analog inner ring portion 160 and the digital inner ring portion 165 are separated by the inner gaps 135a and 135b. In the embodiment shown as IC 100, the inner gaps 135 are positioned according to the boundary between the analog circuit 120 and the digital circuit 115 within the central area 110. Similarly, the analog outer ring portion 180 and the digital outer ring portions 185 are separated by the outer gaps 170a and 170b.

Inner gaps 135 electrically isolate the analog inner ring portion 160 from the digital inner ring portion 165, thus advantageously reducing transfer of electronic noise from the digital circuit 115 (and any associated input/output cells) to the analog circuit 120. Inner gaps 135 need only be large enough to provide electrical isolation, and thus do not substantially reduce the ability of the inner ring to provide the central area 110 with moisture isolation, chemical isolation, and reduced mechanical stress.

Similarly, outer gaps 170 electrically isolate the analog outer ring portion 180 from the digital outer ring portion 185, thus advantageously reducing transfer of electronic noise from the digital circuit 115 to the analog circuit 120. Outer gaps 170 need only be large enough to provide electrical isolation, and thus do not substantially reduce the ability of the inner ring to provide the central area 110 with moisture isolation, chemical isolation, and reduced mechanical stress.

The central area 110 includes: the analog circuit 120, the digital circuit 115, and pads. As used herein, "circuit" refers to one or more circuits that function independently or in conjunction with each other. In some embodiments, the analog circuit 120 includes any combination of a radio frequency (RF) circuit, an analog baseband circuit, or another type of analog circuit. In some embodiments, the digital circuit 115 includes any combination of a digital signal processing (DSP) circuit, a baseband processing (BBP) circuit, or another type of digital circuit. The pads include the analog Vss pads 130; one or more analog Vdd pads (not shown); one or more digital Vss pads (not shown); and one or more digital Vdd pads (not shown).

Optionally, the central area 110 further includes the guard strip 125, which is positioned between and separates the analog circuit 120 from the digital circuit 115. Guard strip 125 is further described in U.S. patent application Ser. No. 12/331,386, filed on Dec. 9, 2008 and entitled "Effective Shield Structure For Improving Substrate Isolation of Analog Circuits From Noisy Digital Circuits On A System-On-Chip (SoC)", by Mansour Keramat, Mehrdad Heshami, and Syed Islam, the contents of which is herein incorporated by reference as though set forth in full.

In the embodiment shown in FIG. 1, both the inner gaps and the outer gaps are within the width of the guard strip 125, which improves the isolation provided by the gaps. Also, the inner gaps and the outer gaps are offset from each other, which improves the protection against mechanical stress and moisture penetration provided by the guard rings.

Figure 2:
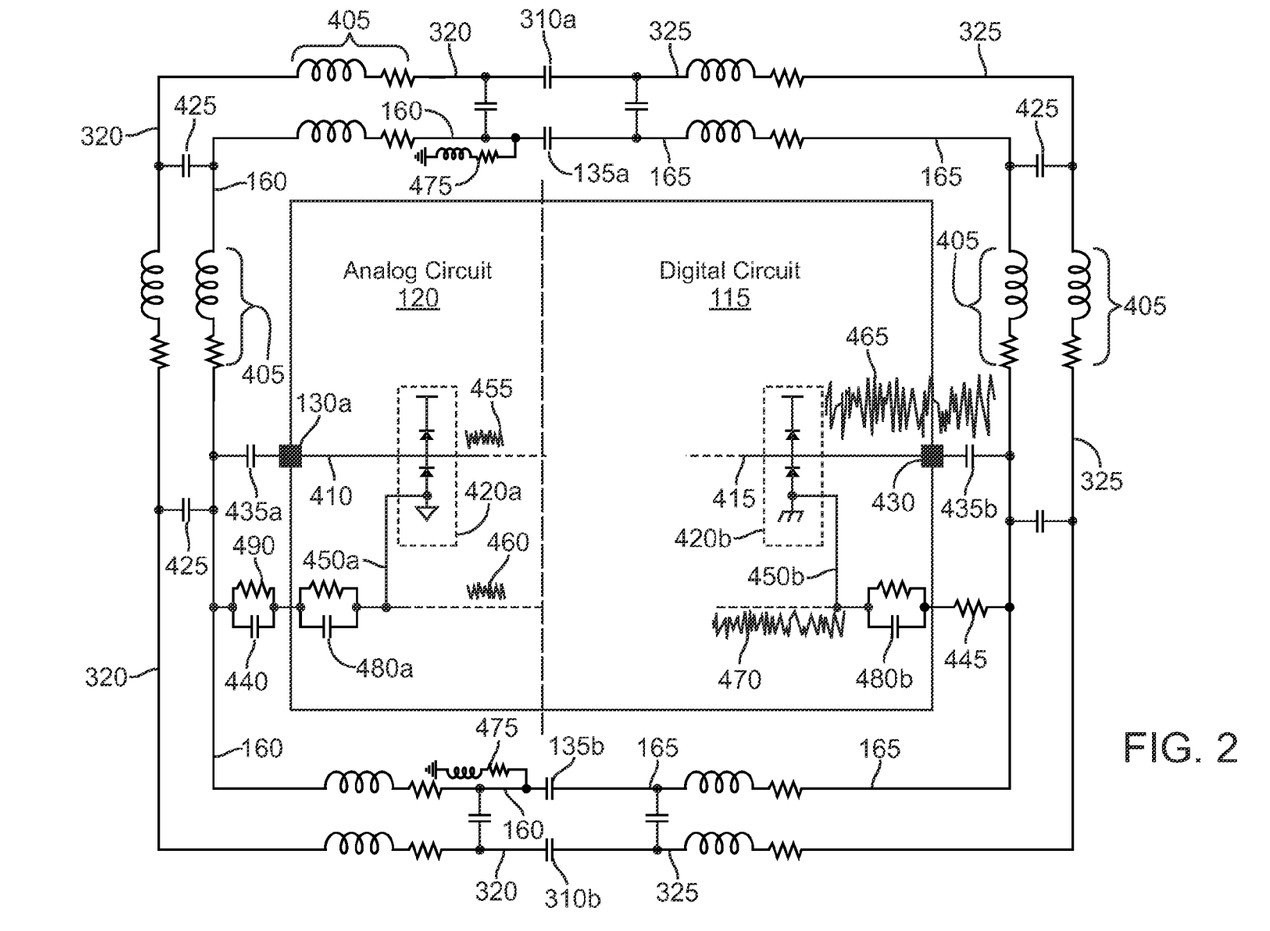
FIG. 2 shows a circuit diagram of an electrical model for the IC shown in FIG. 1.

FIG. 2 shows an circuit model representing the seal rings of integrated circuit 100 and their interfaces with the analog circuit and the digital circuit. That is, FIG. 2 shows the circuit elements and their interconnections of this electrical model.

Each one of the ring portions 160, 165, 180, and 185 is modeled as including inductor/resistor pairs 405 at various places along their length. The crosstalk between the inner analog seal ring and analog pad is modeled with capacitor 435a. Similarly, the interaction between the inner digital seal ring 165 and digital pad within the digital circuit 115 is modeled with capacitor 435b. The inner seal ring and the outer seal ring are modeled as being coupled to each other by capacitors 425 at various places along the length of the seal rings.

Figure 4:
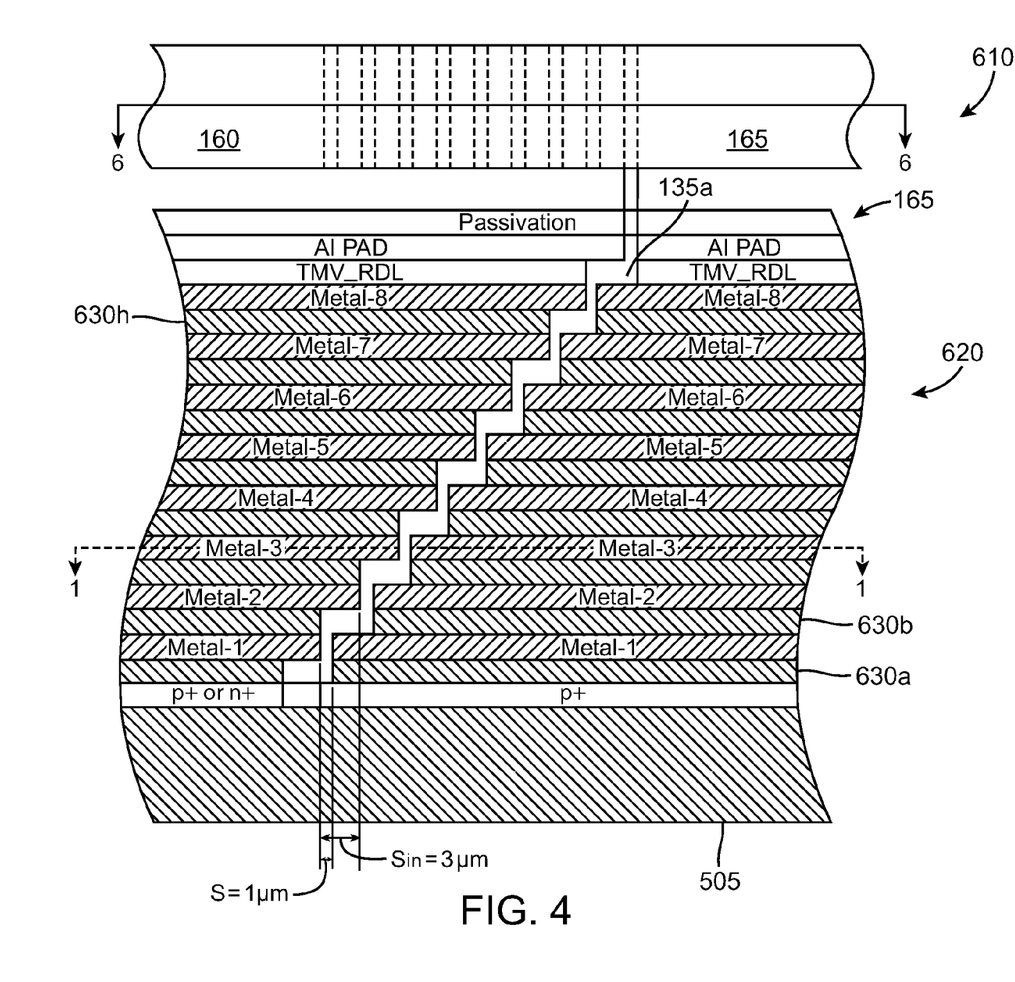
FIG. 4 shows another top view and another cut away side view of the inner seal ring within the IC shown in FIG. 1.

The analog inner ring portion 160 is downbonded to ground through Vss pad 130 at package level and is modeled with resistor inductor pairs 475. As shown in FIG. 4, the interface substrate layer under seal ring on the digital side is p+ diffusion and on the analog side is either p+ or n+ diffusion. The interface between analog inner ring portion 160 and internal analog ground 450a is modeled with resistor (with p+ diffusion) or capacitor (with n+ diffusion) 440 and resistor-capacitor pair 480a. Similarly, the substrate between digital inner ring portion 165 and internal digital ground (Vss) 450b is modeled with resistor 445 and resistor capacitor pair 480b.

Electrostatic discharge (ESD) protection circuit 420a is modeled with diodes between analog Vdd and analog $V_{ss}$ 450a. ESD protection circuit 420b is modeled with diodes between digital Vdd and digital $V_{ss}$ 450b.

The injection of substrate noise from digital Vss 450b to analog Vss 450a directly through substrate is not the focus of the current invention. However embodiments that use guard strip 125 can reduce the coupling of substrate noise from digital Vss 450b to analog Vss 450a directly through substrate. The guard strip 125 is described in U.S. patent application Ser. No. 12/331,386, filed on Dec. 9, 2008, and entitled "Effective Shield Structure For Improving Substrate Isolation of Analog Circuits From Noisy Digital Circuits On a System-On-Chip (SoC)", as cited above.

Waveform 465 represents generated electrical noise on digital I/O pad. In FIG. 2, pads to the right side of guard strip 125 are digital I/O Pads. Pads to the left side of guardstrip 125 including Vss Pads are analog I/O pads.

The amplitude of the waveform 465 is the largest of the four waveforms shown in FIG. 2. Waveform 470 represents generated electrical noise on digital substrate 450*b*. Its amplitude is the second largest of the four waveforms shown in FIG. 2.

Waveform 455 represents the received electrical noise through seal ring on analog $V_{ss}$ 410. Waveform 460 represents the same on analog substrate 450*a*. The amplitudes of waveform 455 and waveform 460 are substantially smaller than those of generated noise waveform 465 or waveform 470. The proposed invention was implemented in a test chip. Based on our analysis, the received electrical on analog side 120 can be 10 dB to 20 dB smaller than that on digital side 115.

Figure 3:
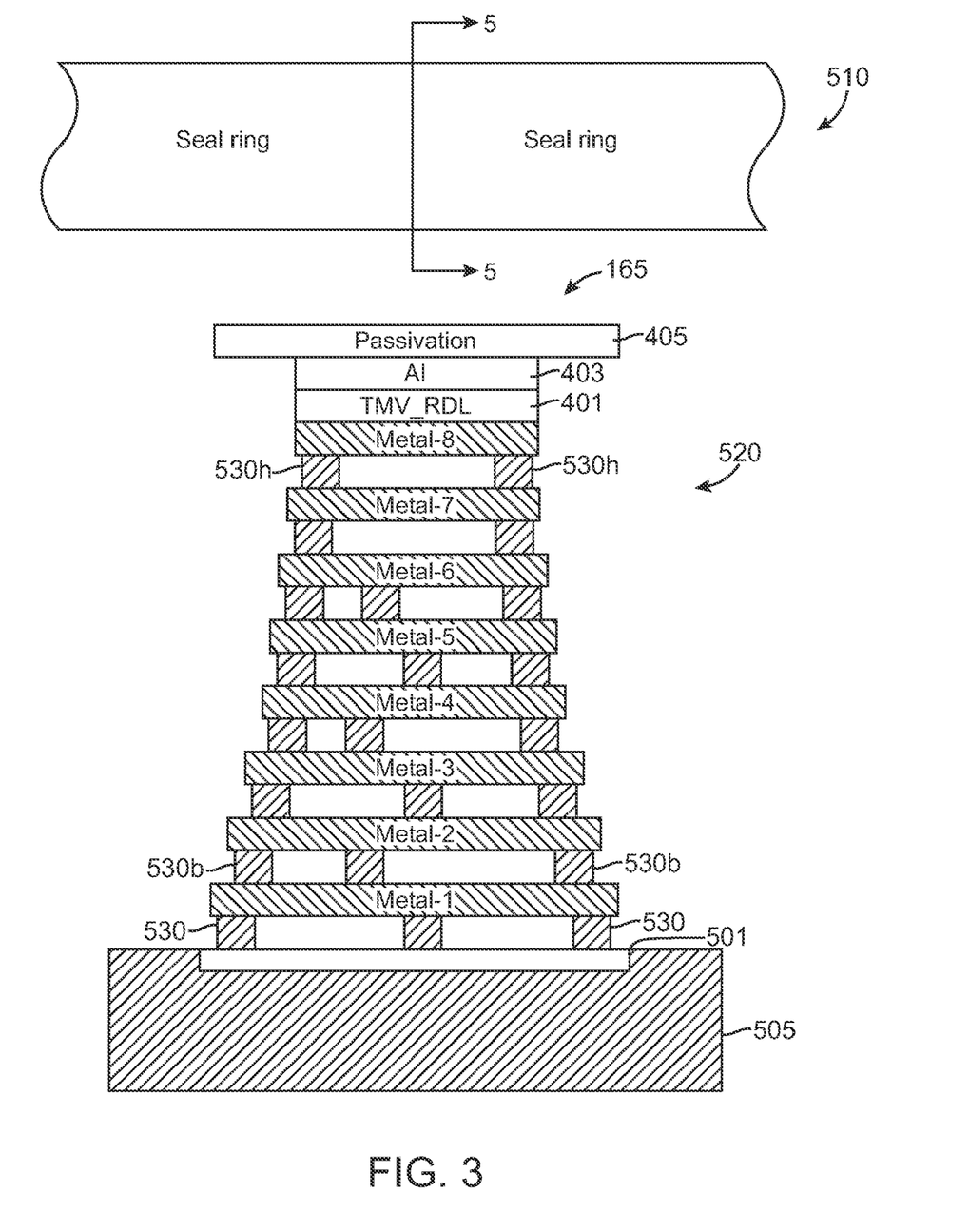
FIG. 3 shows a top view and a cut away side view of the inner seal ring within the IC shown in FIG. 1.

FIG. 3 shows the top view 510 and the cut away side view 520 of the digital seal rings of the present invention. In the cut away side view 520, the portion of the IC 100 to the left of cut line 5 has been removed. FIG. 3 applies both to the inner ring and to the outer ring. FIG. 3 applies to both the inner analog ring and to the outer analog ring, with the exception that the top layer of the substrate for analog ring can be p+ or n+ diffusion.

The seal ring of FIG. 3 is shown to include a p-substrate 505 having a p+ diffusion region 501 on top of which are built layers of metals connected through continuous vias. The region 501 is a region within p-sub 505 into which a p-type dopant has been diffused.

In FIG. 3, the metal-1 layer is shown formed on top of and coupled through the contact 530, to the region 501. Similarly, the metal-2 layer is shown on top of the metal-1 layer but not in contact therewith except in places where the continuous vias 530*b* are shown. The metal-3, metal-4, metal 6, metal-7 and metal-8 layers are similarly shown interconnected through respective continuous vias. The number of metal layers is determined by the design specifications of the IC 100.

As shown in FIG. 3, the top-most metal layer for the seal ring is the aluminum (Al) 403. In some embodiments, Al layer 403 is thick relative to the other layers of the seal ring and is the same layer that is used to form the pads. Al layer 403 is connected to the top-most regular metal layer i.e., metal-8, via the TerMinal Via for Redistribution Layer (TMV_RDL) layer 401. A passivation layer 405 is shown formed on top of the Al layer 403. The passivation layer 405 electrically insulates the active part of the circuit and protects the chip from external environmental damage.

FIG. 4 shows the top view 610 and the cut away side view 620 of the inner seal ring 160 and 165 within the IC 100. In the cut away side view 620, the portion of the IC 100 to below cut line 6 has been removed. Cut line 6 is shown both in FIG. 1 and in the top view 610. FIG. 4 also applies to the outer seal ring 180 and 185, although for simplicity a corresponding cut line has not been shown in FIG. 1.

As shown in both FIGS. 3 and 4, each of the ring portions 160, 165, 180, or 185 includes (in order from bottom to top):

1) diffusion p+, which is a region within p-sub 505 into which a p-type dopant has been diffused;
2) the contact layer 630*a* (shown in FIG. 4);
3) the metal-1 layer;

4) an continuous via layer 630*b* between metal-2 and metal-1. Continuous via layers are placed between metal-2 and metal-3 and the sequence is repeated up to metal-8;
5) the TMV_RDL layer 401 between metal-8 and the Al layer 403;
6) the Al layer 403; and
7) the passivation layer.

In some embodiments, the separation between the metal layers is 1 µm while the separation between via layers is 4 µm.

As shown in FIG. 4, the cut between analog seal ring 160 and digital seal ring 165 is performed at an angle. The angle cut of the seal ring, as shown in FIG. 4, provides a better protection of the chip active area 110 against mechanical stress during die sawing when compared to a seal-ring structure with right-angle cut.

Figure 5:
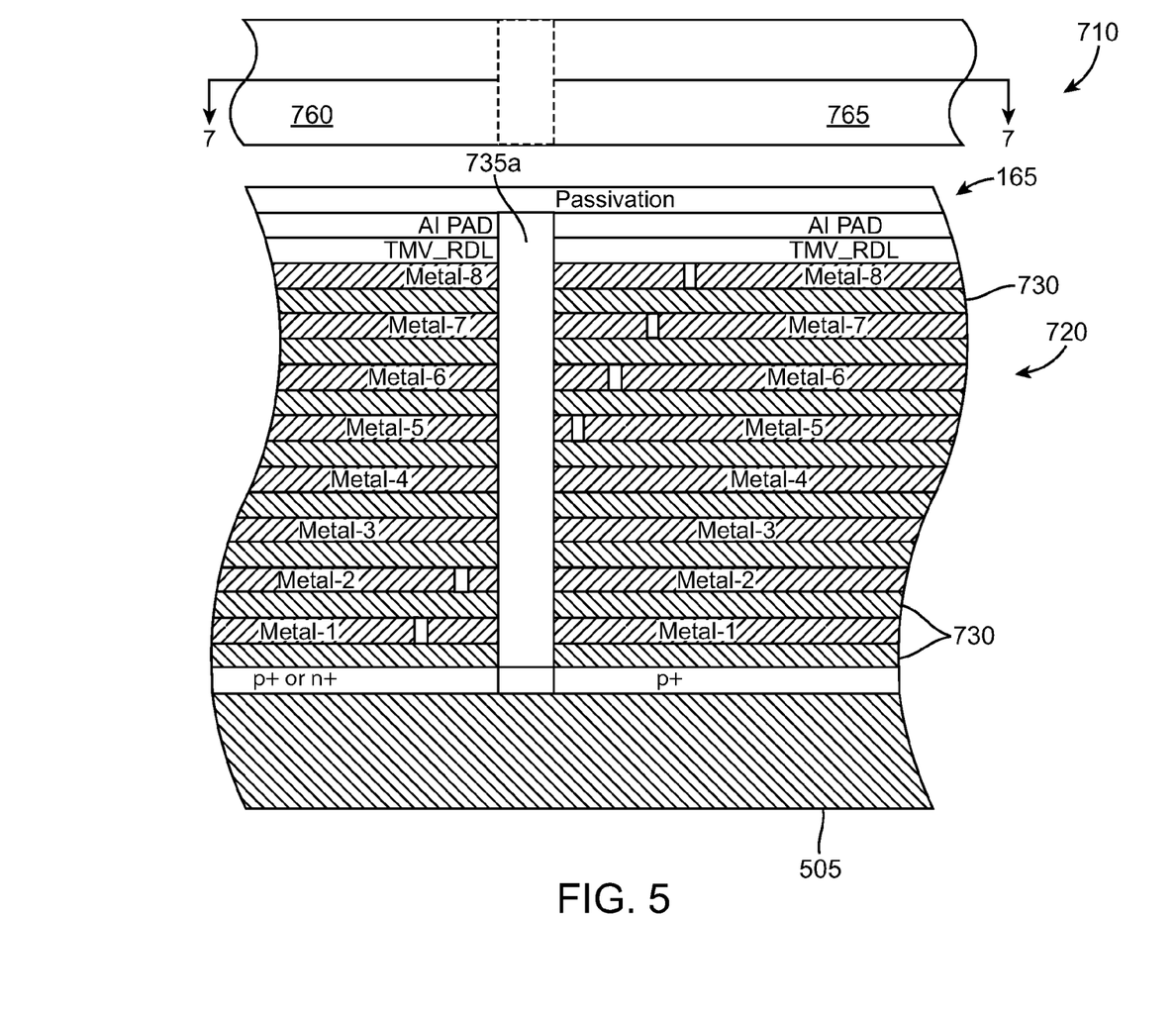
FIG. 5 shows a top view and a cut away side view of the inner seal ring within an IC according to an embodiment.

FIG. 5 shows the top view 710 and the cut away side view 720 of the inner digital ring portion 765 within the IC 700 according to an alternative embodiment. FIG. 5 is similar to FIG. 4 with one exception: FIG. 5 includes gap 735*a* that cuts straight through the via layers 730 and the layers metal-1 though metal-8. In contrast, inner gap 135*a* of FIG. 4 is staggered.

Figure 6:
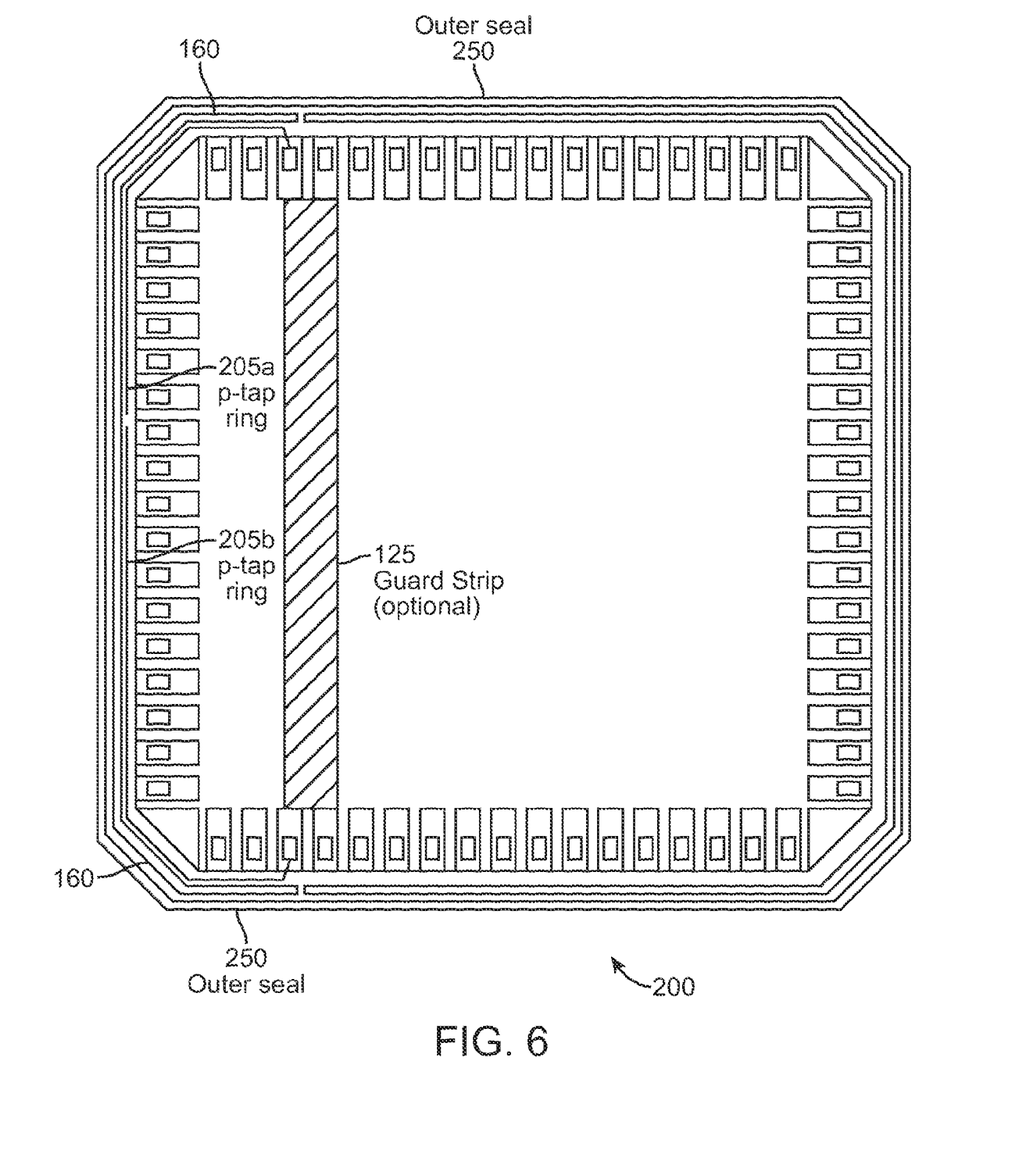
FIG. 6 shows a cut away top view of another IC according to another embodiment of the present invention.

FIG. 6 shows a top view of the IC 200 according to another embodiment. IC 200 is similar to IC 100 as shown in FIG. 1, except that:

1) IC 200 further includes grounded p-tap ring portions 205*a* and 205*b* positioned outside the analog circuit 120 within the central area 110. P-tap ring 205 includes one or more taps into the p-type substrate 505 of IC 200 to provide a low resistance contact to the substrate. P-tap ring 205 improves the isolation between the analog circuit 120 and the digital circuit 115 by reducing coupling between inner analog seal ring and analog I/O pads.
2) In IC 200, the inner analog seal ring 160 is not grounded.
3) In IC 200, the cuts on outer seal ring 250 are optional.

Figure 7:
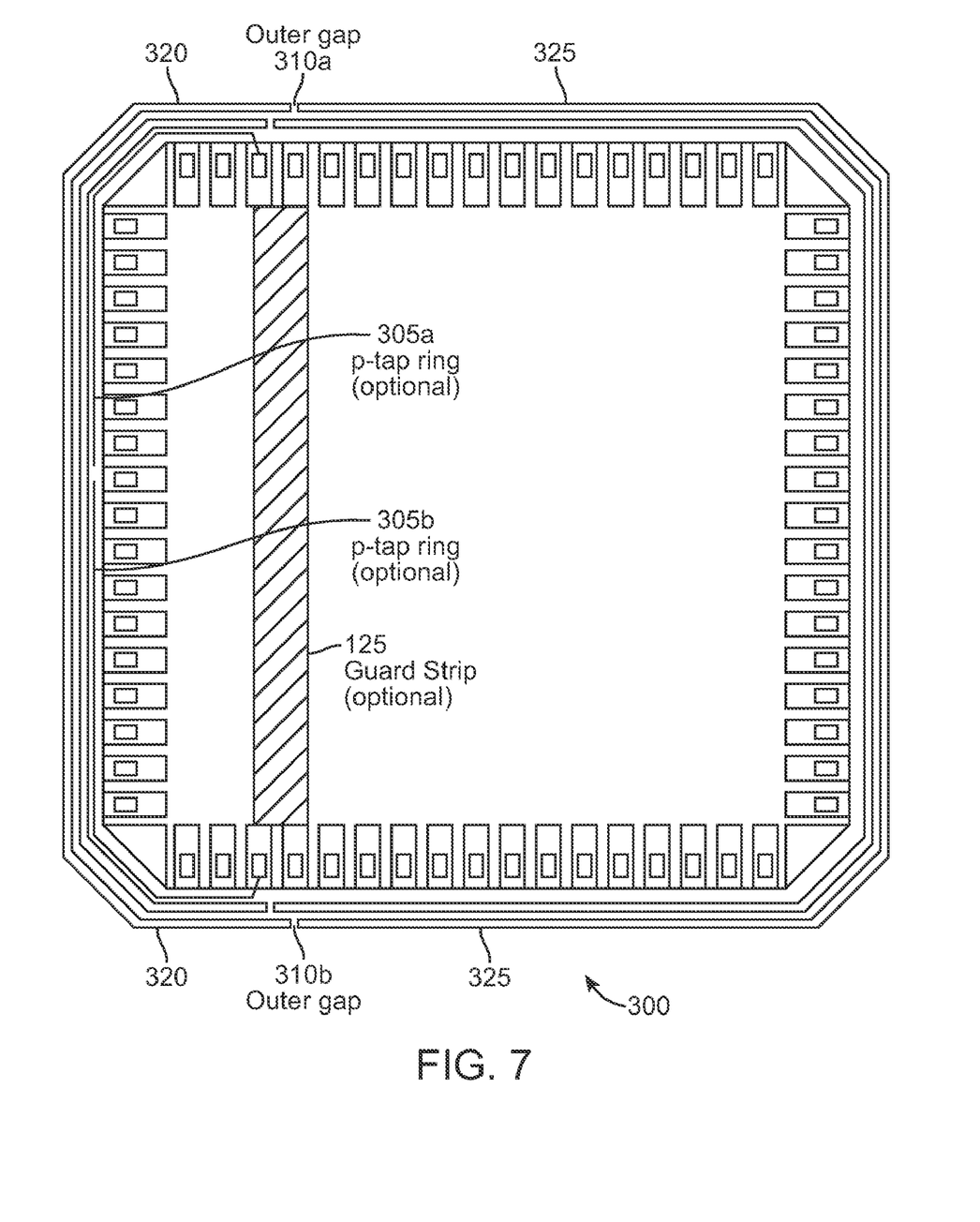
FIG. 7 shows a cut away top view of yet another IC according to yet another embodiment of the present invention.

FIG. 7 shows a top view of the integrated circuit (IC) 300 according to yet another embodiment. IC 300 is analogous to IC 200 except that there is an outer analog seal 320 and an outer digital seal 325 that are separated by the outer gaps 310.

Various combinations of features are shown in the various embodiments of FIGS. 1, 6, and 7. Embodiments that have both an inner seal ring and an outer seal ring tend to provide more moisture isolation, chemical isolation, and better protection against mechanical stress than embodiments with only the inner seal ring, although the exact design of the seal rings also has an important effect. Similarly, embodiments that do not have outer gaps in the outer seal ring tend to provide more moisture isolation, chemical isolation, and reduced mechanical stress than embodiments with gaps in the outer seal ring, although again the exact design of the seal rings also has an important effect. Reduced mechanical stress is particularly important during the manufacturing step in which the fabricated wafers are sawed into individual dies.

On the other hand, embodiments that have gaps in both the inner seal ring and the outer seal ring tend to provide more electrical noise isolation than embodiments with an outer seal ring without gaps, although again the exact design of the seal rings also has an important effect. Similarly, embodiments that have a grounded p-tap ring tend to provide more electrical noise isolation than those without it.

As known by one of ordinary skill in the art, the present invention may be modeled, generated, or both by computer based on a description of the hardware expressed in the syntax and the semantics of a hardware description language (HDL). Such HDL descriptions are often stored on a computer readable medium. Applicable HDLs include, but are not limited to, those at the layout level. Examples of layout level HDLs include, but are not limited to: graphic data system II (GDS II) and open artwork system interchange standard (OASIS).

The present invention includes various embodiments of integrated circuits (ICs) having a seal ring, as described herein. In modern CMOS technologies, is it difficult to implement both a digital circuit and an analog circuit in the same IC without electrical noise from the digital circuit compromising the operation of the analog circuit. This difficulty is exacerbated by typical seal rings that surround the central area of the IC.

In contrast, various embodiments of the present invention may be used to reduce electronic noise transfer via seal rings from a digital circuit to an analog circuit implemented within the same IC. Some embodiments of the present invention also include a guard strip between the digital circuit and the analog circuit, to further reduce electronic noise transfer via the substrate of the IC.

Further, the present invention can be integrated easily in a wide variety of IC design flows by one of ordinary skill in the art.

A variety of specific qualities, quantities, and sizes have been specified herein. These include, but are not limited to: using a p-type dopant and a p-type substrate; using 8 metal layers; using seal rings of 6 µm in width; and using a metal cut of 1 µm for the inner/outer gap 135*a*. It will be clear to one skilled in the art that these and other qualities, quantities, and sizes can be varied widely without departing from the concept and scope of the present invention.

Although the present invention has been described in terms of specific embodiments, it is anticipated that alterations and modifications thereof will no doubt become apparent to those skilled in the art. It is therefore intended that the following claims be interpreted as covering all such alterations and modification as falling within the true spirit and scope of the invention.

What is claimed is:

1. An integrated circuit (IC) having a seal ring, the IC comprising:
    a central area of the IC that contains all circuits of the IC and that is partitioned into a first section containing at least one digital circuit and a second section containing at least one analog circuit;
    an inner seal ring that surrounds the central area and that has two inner gaps, where the inner gaps divide the inner seal ring into an analog inner ring portion and a digital inner ring portion; and
    a guard strip within the central area, where the guard strip is positioned between the analog circuit and the digital circuit.

2. The IC of claim 1, where each of the inner gaps is positioned according to a boundary between the digital circuit and the analog circuit.

3. The IC of claim 1, further comprising an outer seal ring that surrounds the inner seal ring.

4. The IC of claim 1, further comprising an outer seal ring that surrounds the inner seal ring, where the outer seal ring has two outer gaps, and where each of the outer gaps is positioned according to a position of one of the inner gaps.

5. An integrated circuit (IC) having a seal ring, as recited in claim 4, wherein the inner gaps and the outer gaps are offset from each other.

6. The IC of claim 4, where the outer gaps are staggered across those layers of the IC that are above a substrate of the IC.

7. The IC of claim 4, where the outer gaps cut straight through those layers of the IC that are above a substrate of the IC.

8. The IC of claim 1, further comprising packaging that includes:
    a first wire positioned between a first spot on the analog ring portion and a first ground pad within the analog circuit.

9. The IC of claim 8, where the packaging further includes a second wire positioned between a second spot on the analog ring portion and a second ground pad within the analog circuit.

10. The IC of claim 1, further comprising a tap ring formed from one or more taps to the substrate of the IC, where the tap ring is positioned between the analog circuit and the analog ring portion, and where the tap ring has one or more connections to one or more ground pads within the analog circuit.

11. The IC of claim 1, where the inner gaps are staggered across those layers of the IC that are above a substrate of the IC.

12. The IC of claim 1, where the inner gaps cut straight through those layers of the IC that are above a substrate of the IC.

13. A computer readable medium that includes a description of an IC having a seal ring, where the IC comprises:
    a central area of the IC that is partitioned into a first section containing at least one digital circuit and a second section containing at least one analog circuit; and
    an inner seal ring that surrounds the central area and that has two inner gaps, where the inner gaps divide the inner seal ring into an analog inner ring portion and a digital inner ring portion; and
    a guard strip within the central area, where the guard strip is positioned between the analog circuit and the digital circuit.

14. The computer readable medium of claim 13, where each of the inner gaps is positioned according to a boundary between the digital circuit and the analog circuit.

15. The computer readable medium of claim 13, further comprising an outer seal ring that surrounds the inner seal ring.

16. The computer readable medium of claim 13, further comprising an outer seal ring that surrounds the inner seal ring, where the outer seal ring has two outer gaps, and where each of the outer gaps is positioned according to a position of one of the inner gaps.

17. The computer readable medium of claim 13, further comprising packaging that includes:
    a first wire positioned between a first spot on the analog ring portion and a first ground pad within the analog circuit.

18. The computer readable medium of claim 17, where the packaging further includes a second wire positioned between a second spot on the analog ring portion and a second ground pad within the analog circuit.

19. The computer readable medium of claim 13, further comprising a tap ring formed from one or more taps to the substrate of the IC, where the tap ring is positioned between the analog circuit and the analog ring portion, and where the tap ring has one or more connections to one or more ground pads within the analog circuit.

20. The computer readable medium of claim 13, where the inner gaps are staggered across those layers of the IC that are above a substrate of the IC.

21. The computer readable medium of claim 13, where the inner gaps cut straight through those layers of the IC that are above a substrate of the IC.

22. The computer readable medium of claim 16, where the outer gaps are staggered across those layers of the IC that are above a substrate of the IC.

23. The computer readable medium of claim 16, where the outer gaps cut straight through those layers of the IC that are above a substrate of the IC.

24. An integrated circuit (IC) having a seal ring, the IC comprising: digital circuit means located within a central area of the IC; analog circuit means located within the central area; and seal means that surrounds the central area and that has gaps, where the gaps divide the seal means into an analog seal portion and a digital seal portion; and a guard strip within the central area, where the guard strip is positioned between the analog circuit means and the digital circuit means.

25. An integrated circuit (IC) having a seal ring, the IC comprising:
digital circuit means located within a central area of the IC;
analog circuit means located within the central area;
seal means that surrounds the central area and that has gaps, where the gaps divide the seal means into an analog seal portion and a digital seal portion; and
guard strip means within the central area, where the guard strip means is positioned between the analog circuit means and the digital circuit means.

* * * * *

UNITED STATES PATENT AND TRADEMARK OFFICE
CERTIFICATE OF CORRECTION

| | | |
|---|---|---|
| PATENT NO. | : 7,898,056 B1 | Page 1 of 1 |
| APPLICATION NO. | : 12/331373 | |
| DATED | : March 1, 2011 | |
| INVENTOR(S) | : Mansour Keramat, Syed S. Islam and Mehrdad Heshami | |

It is certified that error appears in the above-identified patent and that said Letters Patent is hereby corrected as shown below:

Title page, item [73] Assignee should read as follows:
Alvand Technologies, Inc., Santa Clara, CA (US)

Signed and Sealed this
First Day of May, 2012

David J. Kappos
*Director of the United States Patent and Trademark Office*